(12) United States Patent
Weng et al.

(10) Patent No.: US 10,520,822 B2
(45) Date of Patent: Dec. 31, 2019

(54) LITHOGRAPHY TECHNIQUES FOR REDUCING RESIST SWELLING

(71) Applicant: Taiwan Semiconductor Manufacturing Co., Ltd., Hsinchu (TW)

(72) Inventors: Ming-Hui Weng, New Taipei (TW); Cheng-Han Wu, Taichung (TW); Ching-Yu Chang, Yilang County (TW); Chin-Hsiang Lin, Hsin-chu (TW)

(73) Assignee: TAIWAN SEMICONDUCTOR MANUFACTURING CO., LTD. (TW)

( * ) Notice: Subject to any disclaimer, the term of this patent is extended or adjusted under 35 U.S.C. 154(b) by 8 days.

(21) Appl. No.: 15/639,033

(22) Filed: Jun. 30, 2017

(65) Prior Publication Data

US 2019/0004430 A1   Jan. 3, 2019

(51) Int. Cl.
*G03F 7/40*   (2006.01)
*G03F 7/039*   (2006.01)

(52) U.S. Cl.
CPC .............. *G03F 7/40* (2013.01); *G03F 7/0392* (2013.01)

(58) Field of Classification Search
CPC ........................................................ G03F 7/38
See application file for complete search history.

(56) References Cited

U.S. PATENT DOCUMENTS

| | | |
|---|---|---|
| 8,796,666 B1 | 8/2014 | Huang et al. |
| 9,012,132 B2 | 4/2015 | Chang |
| 9,028,915 B2 | 5/2015 | Change et al. |
| 9,093,530 B2 | 7/2015 | Huang et al. |
| 9,146,469 B2 | 9/2015 | Liu et al. |
| 9,213,234 B2 | 12/2015 | Chang |
| 9,223,220 B2 | 12/2015 | Chang |
| 9,256,133 B2 | 2/2016 | Chang |
| 9,261,786 B2 | 2/2016 | Chang |
| 9,488,913 B2 | 11/2016 | Lai et al. |
| 9,536,759 B2 | 1/2017 | Yang et al. |
| 9,548,303 B2 | 7/2017 | Lee et al. |
| 2002/0012869 A1 | 12/2002 | Adams et al. |

*Primary Examiner* — Kathleen Duda
(74) *Attorney, Agent, or Firm* — Haynes and Boone, LLP

(57) ABSTRACT

The present disclosure provides lithography resist materials and corresponding lithography techniques for improving lithography resolution, in particular, by reducing swelling of resist layers during development. An exemplary lithography method includes performing a treatment process on a resist layer to cause cross-linking of acid labile group components of the resist layer via cross-linkable functional components, performing an exposure process on the resist layer, and performing a development process on the resist layer. In some implementations, the resist layer includes an exposed portion and an unexposed portion after the exposure process, and the treatment process reduces solubility of the unexposed portion to a developer used during the development process by increasing a molecular weight of a polymer in the unexposed portion. The treatment process is performed before or after the exposure process. The treatment process can include performing a thermal treatment and/or an electromagnetic wave treatment to heat the resist layer.

20 Claims, 12 Drawing Sheets

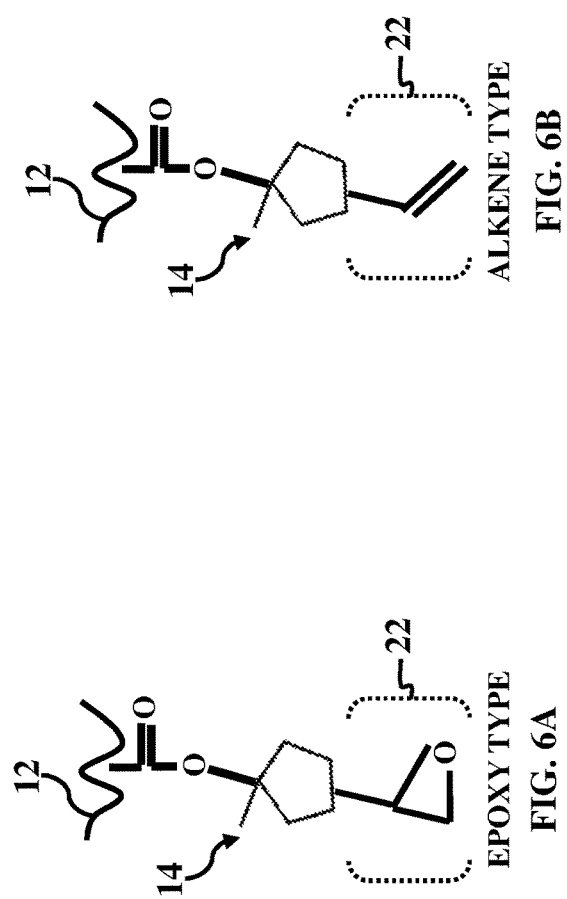
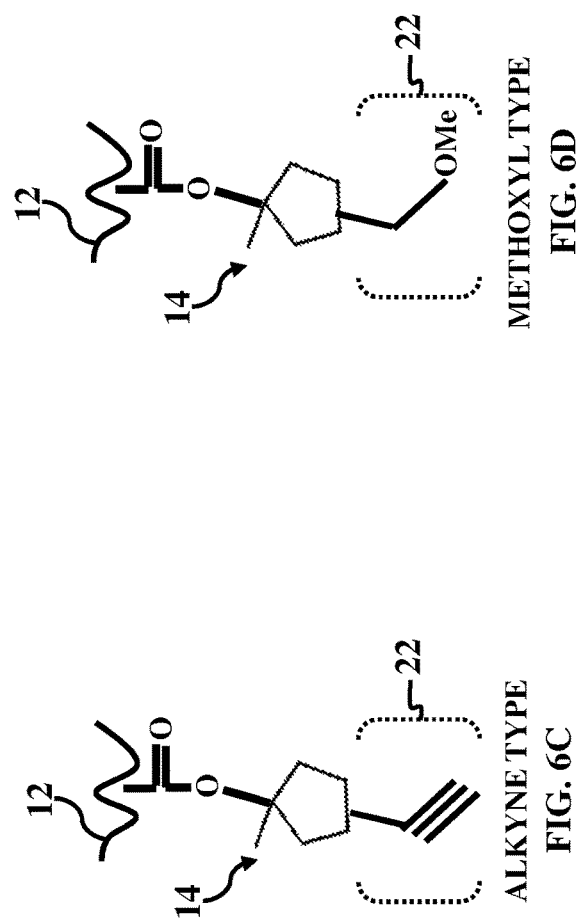
FIG. 6A EPOXY TYPE
FIG. 6B ALKENE TYPE
FIG. 6C ALKYNE TYPE
FIG. 6D METHOXYL TYPE

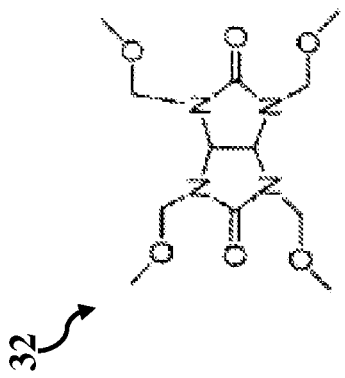
ALKENE TYPE
FIG. 7B
METHOXYL TYPE
FIG. 7E
ALKYNE TYPE
FIG. 7D
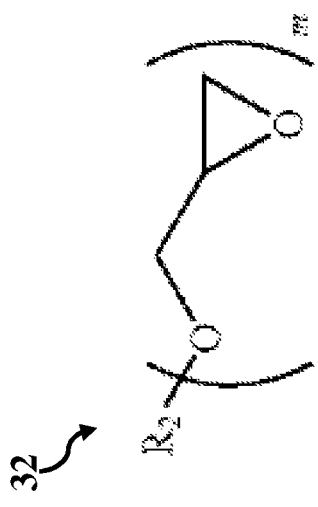
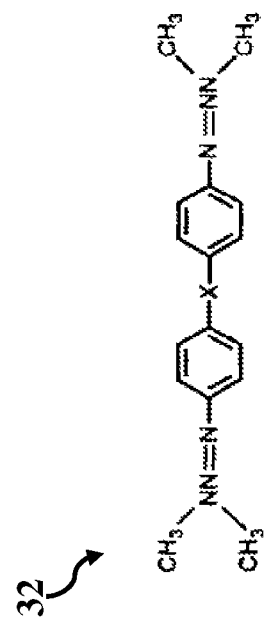
EPOXY TYPE
FIG. 7A
AZIDE TYPE
FIG. 7C

LITHOGRAPHY TECHNIQUES FOR REDUCING RESIST SWELLING

BACKGROUND

Lithography processes are extensively utilized in integrated circuit (IC) manufacturing, where various IC patterns are transferred to a workpiece to form an IC device. A lithography process typically involves forming a resist layer over the workpiece, exposing the resist layer to patterned radiation, and developing the exposed resist layer, thereby forming a patterned resist layer. The patterned resist layer is used as a masking element during subsequent IC processing, such as an etching process, where a resist pattern of the patterned resist layer is transferred to the workpiece. A quality of the resist pattern directly impacts a quality of the IC device. As IC technologies continually progress towards smaller technology nodes (for example, down to 14 nanometers, 10 nanometers, and below), line edge roughness (LER), line width roughness (LWR), and/or contrast of the resist pattern has become critical. Multiple factors affect LER, LWR, and/or contrast of the resist pattern, among which is a developer (in other words, a chemical solution) used for developing the exposed resist layer. Positive tone development (PTD) processes, which remove exposed portions of the resist layer, often use aqueous base developers, and negative tone development (NTD) processes, which remove unexposed portions of the resist layer, often use organic-based developers. Currently, though PTD processes provide sufficient resist contrast, PTD processes cause resist swelling issues that degrade LER and/or LWR. In contrast, though NTD processes typically minimize (or even eliminate) resist swelling issues, NTD processes provide insufficient resist contrast. Accordingly, although existing lithography techniques have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 6A-6D illustrate various chemical structures of a cross-linking functional component that can be included in a resist material, such as the resist material of FIG. 1 or FIG. 3, according to various aspects of the present disclosure.

FIGS. 7A-7E illustrate various chemical structures of a cross linker component that can be included in a resist material, such as the resist material of FIG. 1 or FIG. 3, according to various aspects of the present disclosure.

DETAILED DESCRIPTION

Figures 1, 3:
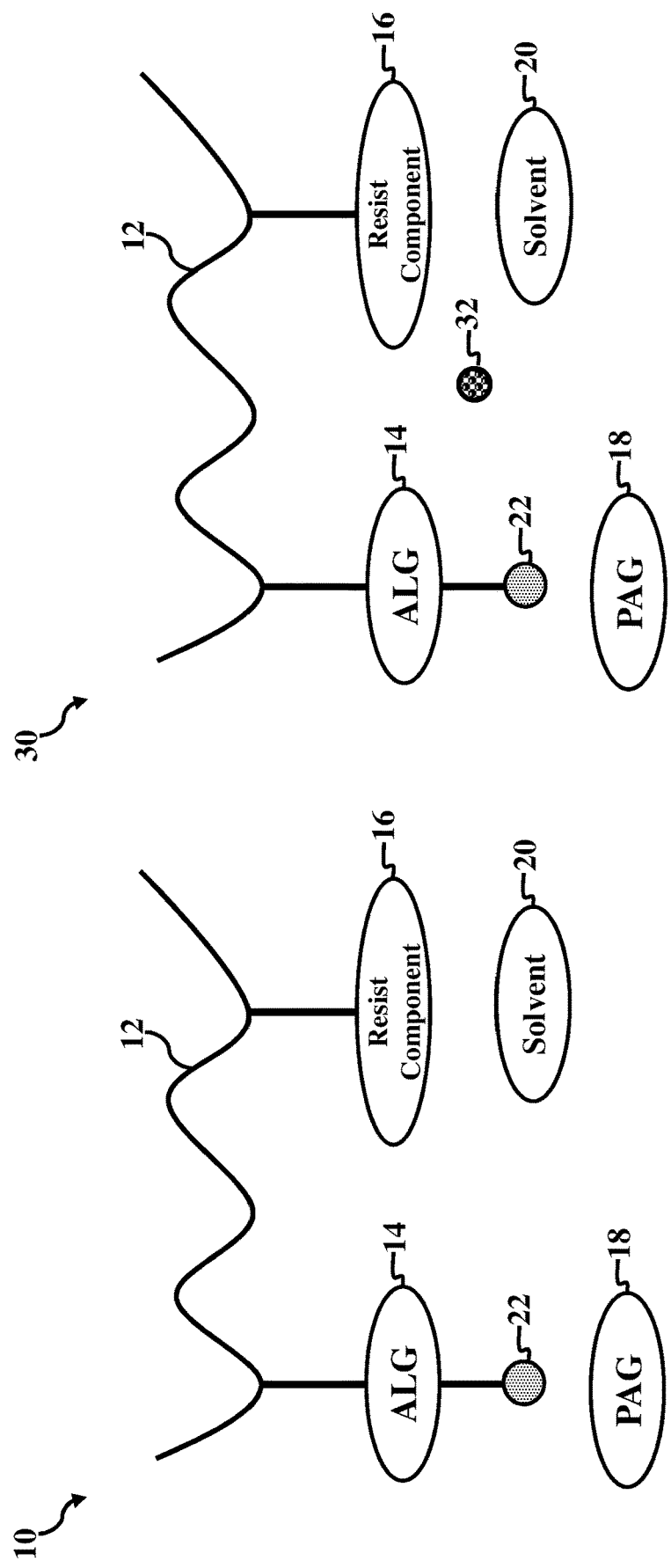
FIG. 1 illustrate a resist material that can be used for forming a resist layer according to various aspects of the present disclosure.
FIG. 3 illustrates another resist material that can be used for forming a resist layer according to various aspects of the present disclosure.

The present disclosure relates generally to methods for manufacturing integrated circuit devices, and more particularly, to lithography techniques and/or lithography materials implemented during manufacturing of integrated circuit devices.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A lithography process involves forming a resist layer over a workpiece and exposing the resist layer to patterned radiation, such as deep ultraviolet (DUV) patterned radiation, extreme UV (EUV) patterned radiation, or electron-beam (e-beam) patterned radiation. For advanced technology nodes (for example, 14 nanometers, 10 nanometers, and below), the lithography process implements radiation sources having ever decreasing wavelengths, such as radiation having a wavelength of less than about 250 nm, to meet finer lithography resolution limits. Advanced lithography materials, such as chemically amplified resist (CAR) materials, have been introduced to improve sensitivity of the resist layer to the radiation, thereby maximizing utilization of the radiation. CAR materials can generate multiple chemical reactions upon exposure to radiation, thereby chemically amplifying a response to the radiation. A resist layer formed from a CAR material includes a polymer that is resistant to an integrated circuit process (such as an etching process), an acid generating component (such as a photoacid generator (PAG)), and a solvent component. The PAG generates acid upon exposure to radiation, which functions as a catalyst for causing chemical reactions that increase (or decrease) solubility of exposed portions of the resist layer. For example, in some implementations, acid generated from the PAG catalyzes cleaving of acid labile groups (ALGs) bonded (linked) to the polymer, thereby changing solubility of exposed portions of the resist layer.

After exposed to the patterned radiation, the resist layer is developed in a developer (in other words, a chemical solution). The developer removes portions of the resist layer (for example, exposed portions of positive tone resist layers or unexposed portions of negative tone resist layers), thereby forming a patterned resist layer. The patterned resist layer is used as a masking element during a subsequent process, such as an etching process or an implantation process, to transfer a pattern in the patterned resist layer (referred to herein as a resist pattern) to the workpiece. Lithography resolution of the resist pattern, such as line edge roughness (LER), line width roughness (LWR), and/or contrast, is limited by the developing process implemented for removing portions of the exposed resist layer. There are generally two types of developing processes: a positive tone development (PTD) process and a negative tone development (NTD) process. The PTD process uses a positive tone developer, which generally refers to a developer that selectively dissolves and removes exposed portions of the resist layer. The NTD process uses a negative tone developer, which generally refers to a developer that selectively dissolves and removes unexposed portions of the resist layer. PTD developers are typically aqueous base developers, such as tetraalkylammonium hydroxide (TMAH), and NTD developers are typically organic-based developers, such as n-butyl acetate (n-BA).

Both PTD processes and NTD processes have drawbacks when attempting to meet lithography resolution demands for advanced technology nodes. NTD processes often fail to produce sufficient developing contrast between exposed portions and unexposed portions of the resist layer (in other words, NTD processes result in poor resist contrast), resulting in higher than desired LER/LWR and/or low patterning fidelity. Though PTD processes can achieve high resist developing contrast, PTD processes have been observed to cause partial swelling in unexposed portions of the resist layer, along with swelling of exposed portions of the resist layer (in some implementations, up to and beyond 100%). For example, in some implementations, when ALGs leave the polymer upon reacting with acid generated by PAGs, branch units of the polymer change into carboxyl-containing groups, such as carboxylic acid (R—COOH), in exposed portions of the resist layer. As a PTD developer penetrates exposed portions of the resist layer, bases of the PTD developer react with the carboxylic acid to form ionic pairs, such that the PTD developer dissolves the exposed portions of the resist layer. Unfortunately, the polymer in unexposed portions of the resist layer often exhibits slight solubility to the PTD developer. The PTD developer can thus penetrate the unexposed portions of the resist layer, increasing a volume of unexposed portions of the resist layer. This causes partial swelling of unexposed portions of the resist layer, particularly unexposed portions of the resist layer adjacent to exposed portions of the resist layer, which negatively impacts line/space (L/S) LER, L/S LWR, and/or contact/hole (C/H) circularity of the patterned resist layer.

A polymer's solubility to the developer, such as the PTD developer, must be reduced to minimize (or eliminate) partial swelling of unexposed portions of the resist layer. Various solutions have been proposed for reducing the polymer's solubility to the developer, such as implementing a bulky base compound in the developer, increasing a glass transition temperature ($T_g$) of the polymer (a temperature above which polymer chains will re-organize into a more ordered state), increasing a hydrophobicity of the polymer, and/or increasing a molecular weight of the polymer. It has been observed that directly increasing the molecular weight of the polymer can degrade lithography patterning fidelity. For example, though a resist layer formed of a resist material that includes a polymer having a higher molecular weight will suppress swelling of unexposed portions of the resist layer, such resist material typically exhibits a low solubility to a developer, such that exposed portions of the resist layer cannot be sufficiently dissolved using conventional PTD developers.

The present disclosure thus proposes resist materials and corresponding lithography techniques that can reduce solubility of unexposed portions of a resist layer to a developer, such as a PTD developer, while maintaining solubility of exposed portions of the resist layer to the developer. In some implementations, the proposed resist materials and corresponding lithography techniques indirectly increase a molecular weight of polymers in unexposed portions of a resist material relative to a molecular weight of polymers in exposed portions of the resist layer, such that partial swelling of unexposed portions is minimized (or even eliminated). By reducing swelling of unexposed portions during the development process, the disclosed resist materials and corresponding lithography techniques produce resist patterns having high pattern fidelity, including reduced LER/LWR and/or C/H circularity with increased resist contrast, thereby meeting lithography resolution demands for advanced technology nodes. Different embodiments disclosed herein offer different advantages and no particular advantage is necessarily required in all embodiments.

FIG. 1 illustrate a resist material 10 that can be used for forming a resist layer during integrated circuit (IC) fabrication according to various aspects of the present disclosure. Characteristics (for example, solubility and/or polarity) of resist material 10 change upon being exposed to radiation used during a lithography process, such DUV radiation (for example, 248 nm radiation from a KrF laser or 193 nm radiation from an ArF laser), EUV radiation (for example, 13.5 nm radiation), e-beam radiation, ion beam radiation, or other suitable radiation. For purposes of the following discussion, resist material 10 is a positive tone resist material used to form a positive tone resist layer, where portions of resist material 10 exposed to radiation become soluble to a developer and unexposed portions of resist material 10 remain insoluble to the developer. Alternatively, the present disclosure contemplates implementations where resist material 10 is a negative tone resist material used to form a negative tone resist layer, where portions of resist material 10 exposed to radiation become insoluble to a developer and unexposed portions of resist material 10 remain soluble to the developer. In some implementations, resist material 10 is sensitive to radiation having a wavelength less than about 250 nm. FIG. 1 has been simplified for the sake of clarity to better understand the inventive concepts of the present disclosure. Additional features can be added in resist material 10, and some of the features described below can be replaced, modified, or eliminated in other embodiments of resist material 10.

In FIG. 1, resist material 10 includes a polymer 12 having a resistance to an IC process used during IC fabrication. For example, polymer 12 has an etch-resistance to an etching process and/or an implant-resistance to an implantation process. In some implementations, polymer 12 includes any number of carbons coupled in a carbon chain, thereby forming a carbon backbone chain. In some implementations, polymer 12 includes a poly(norbornene)-co-malaic anhydride (COMA) polymer, a poly(4-hydroxystyrene) (PHS) polymer, a phenol-formaldehyde (hakelite) polymer, a polyethylene (PE) polymer, a polypropylene (PP) polymer, a polycarbonate polymer, a polyester polymer, or an acrylate-based polymer, such as a poly (methyl methacrylate) (PMMA) polymer.

Figure 5B:
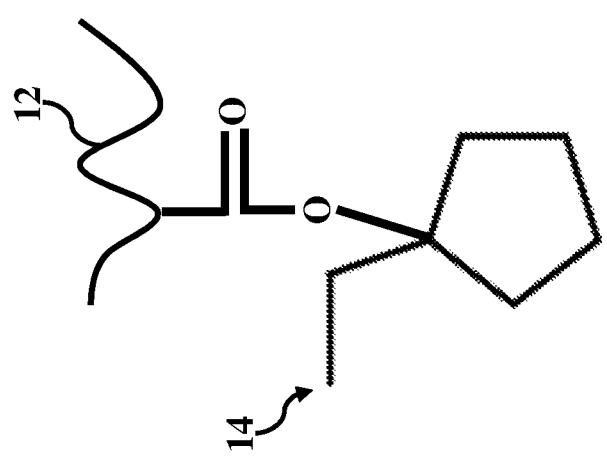
FIG. 5A and FIG. 5B illustrate chemical structures of an acid labile group (ALG) component that can be included in a resist material, such as the resist material of FIG. 1 or FIG. 3, according to various aspects of the present disclosure.
Figure 5A:
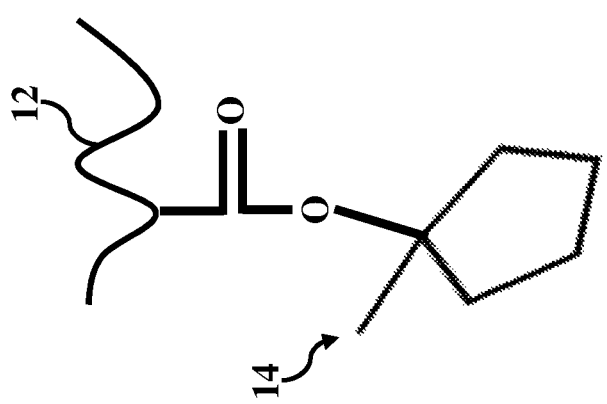

Polymer 12 has one or more functional groups chemically bonded (or linked) thereto, such as an acid labile group (ALG) 14 (also referred to as a dissolution inhibitor) and/or a resist component 16. ALG component 14 chemically changes in response to acid. For example, ALG component 14 is cleaved from polymer 12 upon exposure to acid, thereby changing a solubility and/or polarity of exposed portions of resist material 10. In some implementations, ALG component 14 includes tert-butoxycarbonyl (tBOC). FIG. 5A and FIG. 5B illustrate chemical structures of an exemplary ALG component, such as ALG component 14, that is included in a resist material, such as resist material 10, according to various aspects of the present disclosure. In FIG. 5A, ALG component 14 is methylcyclopentyl (MCP) bonded to a carboxyl group of polymer 12 (in particular, an oxygen of the carboxyl group) via covalent bonding. In FIG. 5B, ALG component 14 is ethylcyclopentyl bonded to a carboxyl group of polymer 12 (in particular, an oxygen of the carboxyl group) via covalent bonding.

Returning to FIG. 1, as noted, resist component 16 is chemically bonded (or linked to) polymer 12. Resist component 16 is configured to interact with other components of resist material 10. In some implementations, resist component 16 includes a thermal acid generator (TAG) component, a quencher (base) component, a chromophore component, a cross-linker component, a surfactant component, and/or other suitable component depending on requirements of resist material 10. The present disclosure also contemplates embodiments where resist component 16 interacts with components of resist material 10, yet is not chemically bonded (or linked) to polymer 12 as depicted in FIG. 1.

Resist material 10 further includes an acid generating component, such as a photoacid generator (PAG) component 18, which generates acid upon absorbing radiation. PAG component 18 thus catalyzes cleaving of ALG component 14 from polymer 12 when exposed to radiation, deprotecting ALG component 14 in exposed portions of resist material 10 and changing characteristics (for example, polarity and/or solubility) of exposed portions of resist material 10. For example, when resist material 10 is exposed with radiation reaching a defined exposure dose threshold, exposed portions of resist material 10 exhibit increased solubility in a developer (for a positive tone resist material), or decreased solubility in a developer (for a negative tone resist material). In some implementations, PAG component 18 includes a fluorine-containing functional group, such as perfluorosulfonate, diphenyliodonium trifluoromethane sulfonate, diphenyliodonium nonafluorobutane sulfonate, triphenylsulfonium trifluromethane sulfonate, triphenylsulfonium nonafluorobutane sulfonate, triphenylsulfonium bis(perfluoromethanesulfonyl) imide, fluorine-containing functional group, or combinations thereof. In some implementations, PAG component 18 includes a phenyl ring based functional group, a heterocyclic ring based functional group, other suitable functional group, or combinations thereof. In some implementations, where resist material 10 includes a quencher component, the quencher neutralizes acid, such that the quencher inhibits acid generated by PAG component 18 from reacting with ALG component 14. In some implementations, the quencher is a photo-decomposable base (PDB) component.

When forming resist material 10, polymer 12, ALG component 14, resist component 16, and PAG component 18 are mixed in a solvent 20, thereby forming a resist solution that is coated over a workpiece. In some implementations, solvent 20 is an aqueous solvent. In some implementations, solvent 20 is an organic-based solvent, such as PGMEA (propylene glycol monomethyl ether acetate) (2-methoxy-1-methylethylacetate), PGME (propylene glycol monomethyl ether), PGEE (propyleneglycol monoethylether), GBL (gamma-butyrolacetone), CHN (cyclohexanone, n-butyl acetate), MIBC (methyl isobutyl carbinol), 2-heptanone, other suitable organic-based solvent, or combinations thereof.

The present disclosure proposes adding cross-linkable functionality to ALG component 14, which facilitates indirectly increasing a molecular weight of polymer 12 in unexposed portions of a resist layer including resist material 10, thereby reducing solubility of unexposed portions of the resist layer to a developer while maintaining solubility of exposed portions of the resist layer. For example, in FIG. 1, ALG component 14 further includes a cross-linkable functional component 22 bonded (linked) thereto. Cross-linkable functional component 22 reacts with other cross-linkable functional components in response to a treatment performed on a resist layer including resist material 10, thereby cross-linking unexposed portions of the resist layer. In some implementations, the treatment heats resist material 10 to a temperature that induces cross-linking of cross-linkable functional component 22 with other cross-linkable functional components (not shown) bonded to other ALG components (not shown). In some implementations, the treatment is referred to as a cross-linking treatment. In some implementations, the treatment includes a thermal treatment that heats resist material 10 to a temperature that induces cross-linking of cross-linkable functional components 22. In some implementations, the treatment is an electromagnetic wave treatment that heats resist material 10 to a temperature that induces cross-linking of cross-linkable functional components 22. Cross-linking unexposed portions of the resist layer increases a molecular weight of polymer 12 in unexposed portions of the resist layer, reducing solubility of unexposed portions layer, and thus minimizing (or even eliminating) swelling of unexposed portions.

Figure 2A:
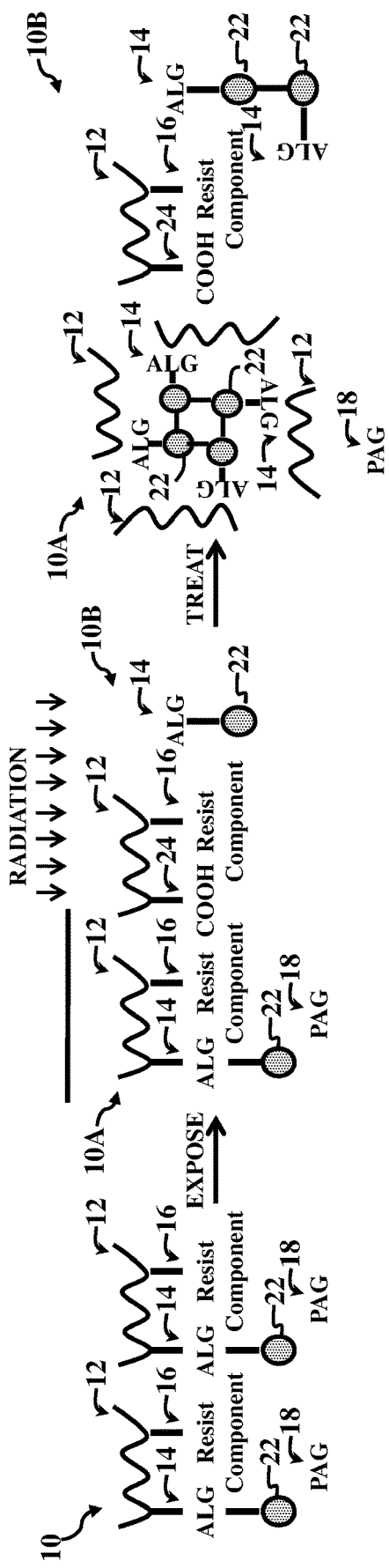
FIG. 2A and FIG. 2B illustrate different lithography process flows for decreasing solubility of unexposed portions of a resist layer including the resist material of FIG. 1 according to various aspects of the present disclosure.

FIG. 2A illustrates a lithography process flow for decreasing solubility of unexposed portions of a resist layer including resist material 10 according to various aspects of the present disclosure. In FIG. 2A, a resist layer including resist material 10 is formed over a workpiece, and an exposure process is performed on the resist layer, such that resist material 10 includes an unexposed portion 10A and an exposed portion 10B. Exposed portion 10B is illuminated with radiation, which causes PAG component 18 in exposed portion 10B to generate acid upon absorbing radiation and catalyze cleaving of ALG component 14 from polymer 12. In some implementations, a post exposure bake process is performed on the resist layer to cause ALG component 14 to cleave from polymer 12. PAG 18 thus deprotects ALG component 14 in exposed portion 10B, changing a branch unit of polymer 12 into a carboxyl-containing component 24, such as COOH. This increases solubility of exposed portion 10B to a developer, such as a PTD developer. For example, a base of the developer reacts with carboxyl-containing component 24 to form an ionic pair as the developer penetrates exposed portion 10B, such that the developer can dissolve exposed portion 10B. A resist treatment is then performed on the resist layer to increase a molecular weight of polymer 12 of resist material 10 in unexposed portion 10A. For example, the resist treatment heats the resist layer to a temperature that induces cross-linking of cross-linkable functional components 22 with one another, forming a polymer matrix in unexposed portion 10A where ALG components 14 are cross-linked via cross-linkable functional components 22. Though the resist treatment causes ALG components 14 to cross-link via cross-linkable functional components 22 in exposed portion 10B, this does not increase a molecular weight of polymer 12 in exposed portion 10B since ALG components 14 are cleaved from polymer 12 after the exposure and/or PEB process. Solubility of unexposed portion 10A to the developer is thus decreased without decreasing solubility of exposed portion 10B to the developer, suppressing swelling of unexposed portion 10A of the resist layer during a development process. FIG. 2A has been simplified for the sake of clarity to better understand the inventive concepts of the present disclosure. Additional steps can be provided before, during, and after the lithography process flow, and some of the steps described can be moved, replaced, or eliminated for additional embodiments of the lithography process flow.

Figure 2B:
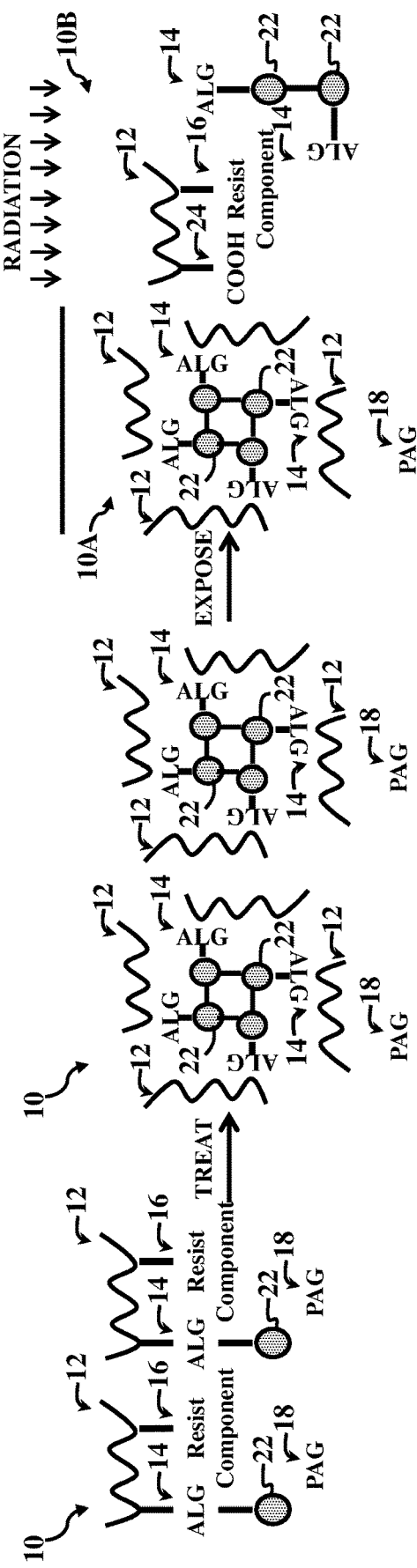

FIG. 2B illustrates another lithography process flow for decreasing solubility of unexposed portions of a resist layer including resist material 10 according to various aspects of the present disclosure. In FIG. 2B, a resist layer including resist material 10 is formed over a workpiece, and a resist treatment is performed on the resist layer to increase a molecular weight of polymer 12 of resist material 10 before an exposure process. For example, the resist treatment heats the resist layer to a temperature that induces cross-linking of cross-linkable functional components 22 with one another, forming polymer matrixes in the resist layer where ALG components 14 are cross-linked via cross-linkable functional components 22. An exposure process is then performed on the resist layer, such that resist material 10 includes unexposed portion 10A and exposed portion 10B. Similar to FIG. 2A, exposed portion 10B is illuminated with radiation, which causes PAG component 18 in exposed portion 10B to generate acid upon absorbing radiation and catalyze cleaving of ALG component 14 from polymer 12. In some implementations, a PEB process is performed on the resist layer to cause ALG component 14 to cleave from polymer 12. PAG 18 thus deprotects ALG component 14 in exposed portion 10B, changing a branch unit of polymer 12 into a carboxyl-containing component 24, such as COOH. This increases solubility of exposed portion 10B to a developer. For example, a base of the developer reacts with carboxyl-containing component 24 to form an ionic pair as the developer penetrates exposed portion 10B, such that the developer can dissolve exposed portion 10B. Since ALG components 14 are cleaved from polymer 12 during the exposure process, ALG components 14 cross-linked via cross-linkable functional components 22 in exposed portion 10B do not increase a molecular weight of polymer 12 in exposed portion 10B. Solubility of unexposed portion 10A to the developer is thus decreased without decreasing solubility of exposed portion 10B, suppressing swelling of unexposed portion 10A of the resist layer during a development process. FIG. 2B has been simplified for the sake of clarity to better understand the inventive concepts of the present disclosure. Additional steps can be provided before, during, and after the lithography process flow, and some of the steps described can be moved, replaced, or eliminated for additional embodiments of the lithography process flow.

Turning again to FIG. 1, in some implementations, cross-linkable functional component 22 includes glycidyl ether based functional group, an alkyl oxide based functional group, an alkene based functional group, an alkyne based functional group, a triazene based functional group, an epoxide based functional group, other suitable cross-linkable functional group, or combinations thereof. FIGS. 6A-6D illustrate chemical structures of exemplary cross-linkable functional components, such as cross-linkable functional component 22, that can be included in a resist material, such as resist material 10, according to various aspects of the present disclosure. The depicted cross-linkable functional components facilitate cross-linking of ALG components of a resist material, such as ALG component 14 of resist material 10. In FIG. 6A, cross-linkable functional component 22 includes an epoxy functional group bonded to ALG component 14. In FIG. 6B, cross-linkable functional component 22 includes an alkene functional group bonded to ALG component 14. In FIG. 6C, cross-linkable functional component 22 includes an alkyne functional group bonded to ALG component 14. In FIG. 6D, cross-linkable functional component 22 includes a methoxyl functional group bonded to ALG component 14.

FIG. 3 illustrates a resist material 30 that can be used for forming a resist layer during IC fabrication according to various aspects of the present disclosure. Resist material 30 is substantially similar to resist material 10. For example, resist material 30 includes polymer 12, ALG component 14, resist component 16, and PAG 18 mixed in solvent 20. ALG component 14 further includes cross-linkable functional component 22 bonded (linked) thereto. In contrast to resist material 10, resist material 30 further includes a cross-linker 32 mixed in solvent 20 that facilitates crosslinking of cross-linkable functional component 22 with other cross-linkable functional components (not shown) bonded to other ALG components (not shown) in response to a treatment performed on a resist layer including resist material 30, thereby cross-linking unexposed portions of the resist layer. In some implementations, the treatment heats resist material 30 to a temperature that induces cross-linking of cross-linkable functional component 22 with cross-linker 32, such that cross-linkable functional component 22 is cross-linked with other cross-linkable functional components via cross-linker 32 and ALG component 14 is cross-linked with other ALG components via cross-linkable functional component 22. In some implementations, the treatment includes a thermal treatment that heats resist material 30 to a temperature that induces cross-linking of cross-linkable functional component 22 with cross-linker 32. In some implementations, the treatment is an electromagnetic wave treatment that heats resist material 30 to a temperature that induces cross-linking of cross-linkable functional components 22 with cross-linker 32. Cross-linking unexposed portions of the resist layer increases a molecular weight of polymer 12 in unexposed portions of the resist layer, reducing solubility of unexposed portions of the resist layer, and thus minimizing (or even eliminating) swelling of unexposed portions. Additional features can be added in resist material 30, and some of the features described below can be replaced, modified, or eliminated in other embodiments of resist material 30.

Figure 4A:
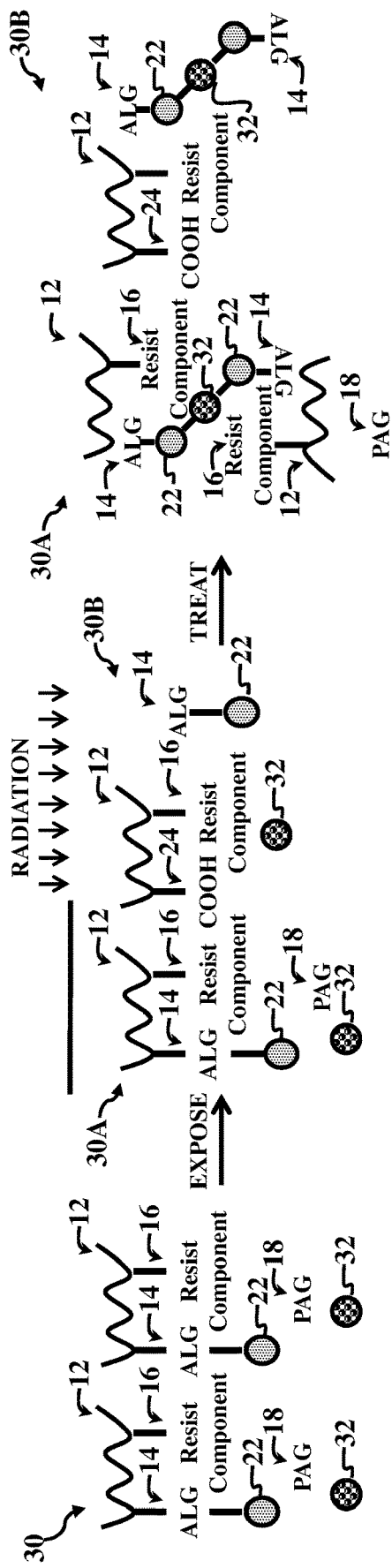
FIG. 4A and FIG. 4B illustrate different lithography process flows for decreasing solubility of unexposed portions of a resist layer including the resist material of FIG. 3 according to various aspects of the present disclosure.

FIG. 4A illustrates a lithography process flow for decreasing solubility of unexposed portions of a resist layer including resist material 10 according to various aspects of the present disclosure. In FIG. 4A, a resist layer including resist material 30 is formed over a workpiece, and an exposure process is performed on the resist layer, such that resist material 30 includes an unexposed portion 30A and an exposed portion 30B. Exposed portion 30B is illuminated with radiation, which causes PAG component 18 in exposed portion 30B to generate acid upon absorbing radiation and catalyze cleaving of ALG component 14 from polymer 12. In some implementations, a PEB process is performed on the resist layer to cause ALG component 14 to cleave from polymer 12. PAG 18 thus deprotects ALG component 14 in exposed portion 30B, changing a branch unit of polymer 12 into a carboxyl-containing component 24. This increases solubility of exposed portion 30B to a developer. For example, a base of the developer reacts with carboxyl-containing component 24 to form an ionic pair as the developer penetrates exposed portion 30B, such that the developer can dissolve exposed portion 30B. A resist treatment is then performed on the resist layer to increase a molecular weight of polymer 12 of resist material 30 in unexposed portion 30A. For example, the resist treatment heats the resist layer to a temperature that induces cross-linking of cross-linkable functional component 22 with cross-linker 32, forming a polymer matrix in unexposed portion 30A where ALG components 14 are cross-linked via cross-linkable functional components 22 (which are cross-linked via cross-linkers 32). Though the resist treatment causes ALG components 14 to cross-link via cross-linkable functional components 22 in exposed portion 30B, this does not increase a molecular weight of polymer 12 in exposed portion 10B since ALG components 14 are cleaved from polymer 12 after the exposure and/or PEB process. Solubility of unexposed portion 30A to the developer is thus decreased without decreasing solubility of exposed portion 30B to the developer, suppressing swelling of unexposed portion 30A of the resist layer during a development process. FIG. 4A has been simplified for the sake of clarity to better understand the inventive concepts of the present disclosure. Additional steps can be provided before, during, and after the lithography process flow, and some of the steps described can be moved, replaced, or eliminated for additional embodiments of the lithography process flow.

Figure 4B:
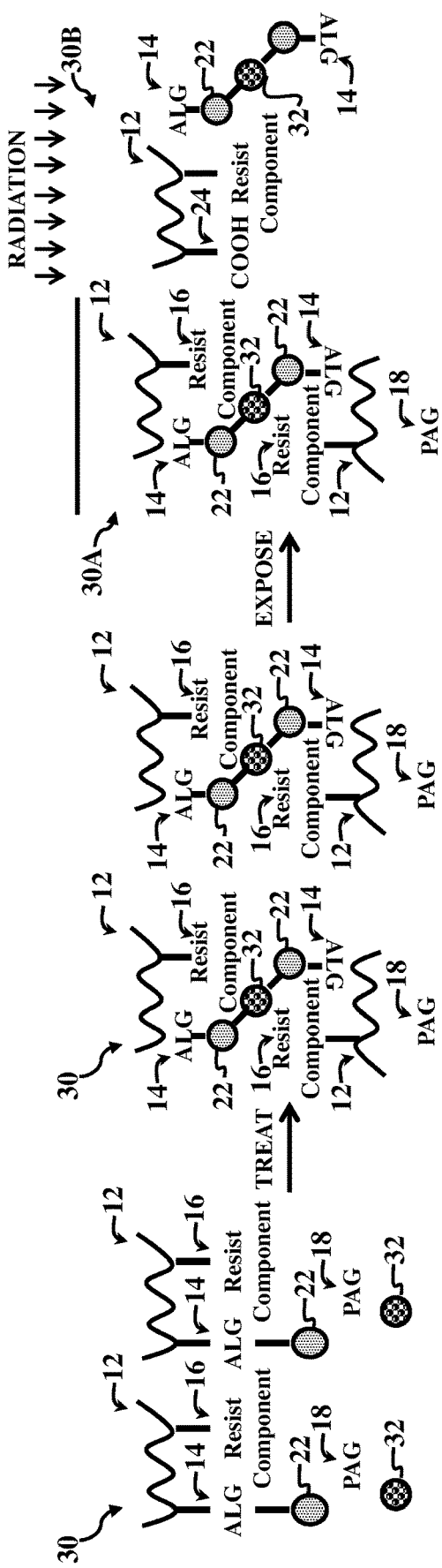

FIG. 4B illustrates another lithography process flow for decreasing solubility of unexposed portions of a resist layer including resist material 30 according to various aspects of the present disclosure. In FIG. 4B, a resist layer including resist material 30 is formed over a workpiece, and a resist treatment is performed on the resist layer to increase a molecular weight of polymer 12 of resist material 30 before an exposure process. For example, the resist treatment heats the resist layer to a temperature that induces cross-linking of cross-linkable functional components 22 with cross-linker 32, forming polymer matrixes in the resist layer where ALG components 14 are cross-linked via cross-linkable functional components 22 (which are cross-linked via cross-linkers 32). An exposure process is then performed on the resist layer, such that resist material 30 includes unexposed portion 30A and exposed portion 30B. Similar to FIG. 4A, exposed portion 30B is illuminated with radiation, which causes PAG component 18 in exposed portion 30B to generate acid upon absorbing radiation and catalyze cleaving of ALG component 14 from polymer 12. In some implementations, a PEB process is performed on the resist layer to cause ALG component 14 to cleave from polymer 12. PAG 18 thus deprotects ALG component 14 in exposed portion 30B, changing a branch unit of polymer 12 into a carboxyl-containing component 24. This increases solubility of exposed portion 30B to a developer. For example, a base of the developer reacts with carboxyl-containing component 24 to form an ionic pair as the developer penetrates exposed portion 30B, such that the developer can dissolve exposed portion 10B. Since ALG components 14 are cleaved from polymer 12 during the exposure and/or PEB process, ALG components 14 cross-linked via cross-linkable functional components 22, which are cross-linked via cross-linker 32, in exposed portion 30B do not increase a molecular weight of polymer 12 in exposed portion 30B. Solubility of unexposed portion 30A to the developer is thus decreased without decreasing solubility of exposed portion 30B, suppressing swelling of unexposed portion 30A of the resist layer during a development process. FIG. 4B has been simplified for the sake of clarity to better understand the inventive concepts of the present disclosure. Additional steps can be provided before, during, and after the lithography process flow, and some of the steps described can be moved, replaced, or eliminated for additional embodiments of the lithography process flow.

Turning again to FIG. 3, in some implementations, cross-linker 32 includes any functional group that can facilitate cross-linking of cross-link functional components 22. FIGS. 7A-7E illustrate chemical structures of exemplary cross-linkers, such as cross-linker 32, that can be included in a resist material, such as resist material 30, according to various aspects of the present disclosure. The depicted cross-linkers facilitate cross-linking of ALG components of a resist material, such as ALG component 14 of resist material 10. In FIG. 7A, cross-linker 32 includes an epoxy functional group. In FIG. 7B, cross-linker 32 includes an alkene functional group. In FIG. 7C, cross-linker 32 includes an azide functional group. In FIG. 7D, cross-linker 32 includes an alkyne functional group. In FIG. 7E, cross-linker 32 includes a methoxyl functional group.

Figure 8:
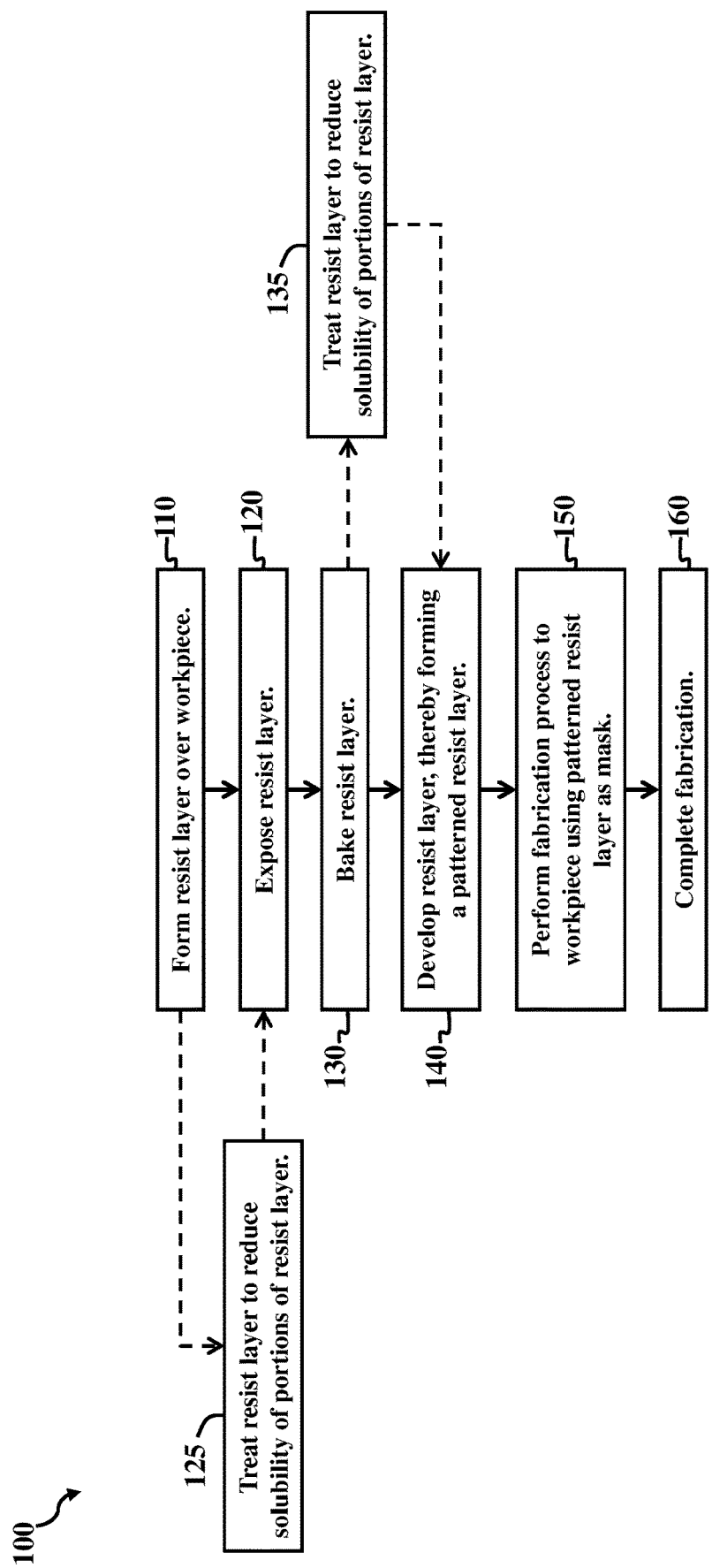
FIG. 8 is a flow chart of a lithography method for processing a workpiece according to various aspects of the present disclosure.

FIG. 8 is a flow chart of a lithography method 100 for processing a workpiece (for example, a substrate) according to various aspects of the present disclosure. In some implementations, method 100 is implemented, in whole or in part, by a system employing advanced lithography processes, such as DUV lithography, EUV lithography, e-beam lithography, x-ray lithography, and/or other lithography to enhance lithography resolution. At block 110, a resist layer is formed over a workpiece. At block 120, the resist layer is exposed, for example, to patterned radiation. In some implementations, the resist layer is treated to reduce solubility of portions of the resist layer to a developer before exposing the resist layer at block 125. At block 130, the resist layer is baked, for example, by a post exposure baking process. In some implementations, the resist layer is treated to reduce solubility of portions of the resist layer to the developer after exposing and/or baking the resist layer at block 135. At block 140, the resist layer is developed, thereby forming a patterned resist layer. At block 150, a fabrication process is performed to the workpiece using the patterned resist layer as a mask. At block 160, method 100 can proceed with completing fabrication of the workpiece. Additional steps can be provided before, during, and after method 100, and some of the steps described can be moved, replaced, or eliminated for additional embodiments of method 100.

FIGS. 9A-9E are fragmentary cross-sectional views of a workpiece 200, in portion or entirety, at various fabrication stages (such as those associated with lithography method 100) according to various aspects of the present disclosure.

Workpiece 200 is depicted at an intermediate stage of fabrication (or processing) of an IC device, such as a microprocessor, a memory, and/or other IC device. In some implementations, workpiece 200 may be a portion of an IC chip, a system on chip (SoC), or portion thereof, that includes various passive and active microelectronic devices, such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, fin-like field effect transistors (FinFETs), other suitable IC components, or combinations thereof. FIGS. 9A-9E have been simplified for the sake of clarity to better understand the inventive concepts of the present disclosure. Additional features can be added in workpiece 200, and some of the features described below can be replaced, modified, or eliminated in other embodiments of workpiece 200.

Figure 9A:
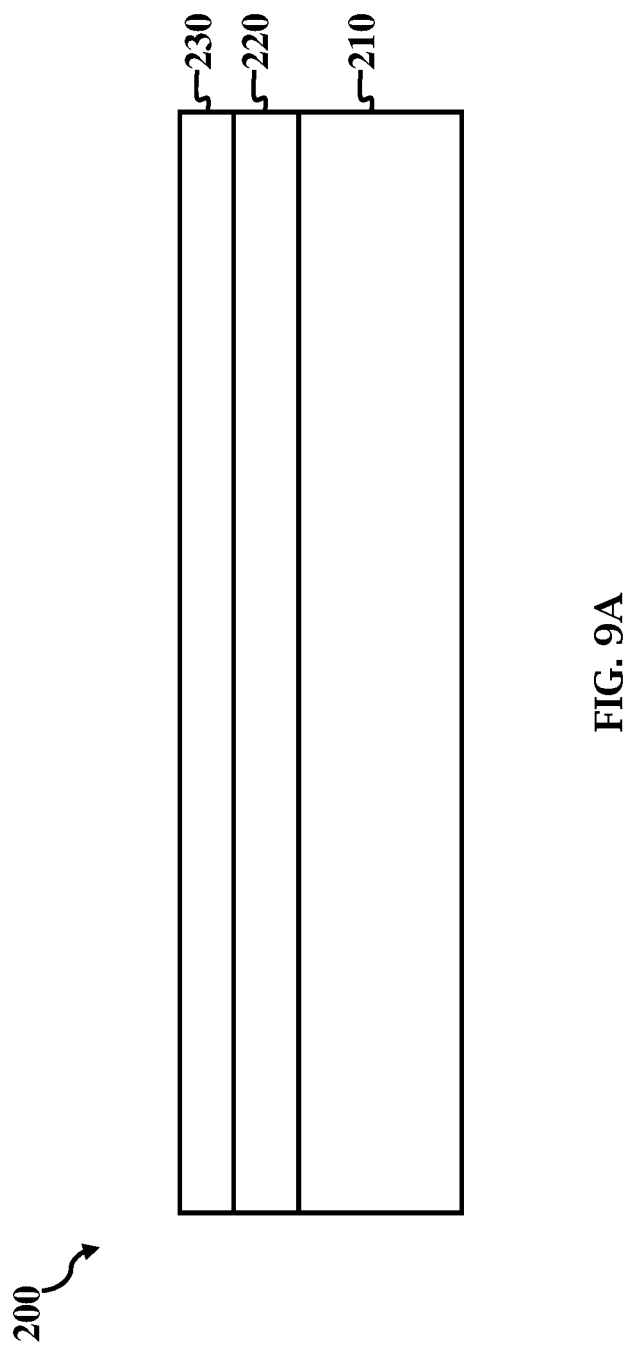
FIGS. 9A-9E are fragmentary cross-sectional views of a workpiece, in portion or entirety, at various fabrication stages (such as those associated with the lithography method of FIG. 8) according to various aspects of the present disclosure.

In FIG. 9A, workpiece 200 includes a wafer 210, which includes a substrate (for example, a semiconductor substrate), a mask (also referred to as a photomask or reticle), or any base material on which processing may be conducted to provide layers of material to form various features of an IC device. Depending on IC fabrication stage, wafer 210 includes various material layers (for example, dielectric layers, semiconductor layers, and/or conductive layers) configured to form IC features (for example, doped regions/features, isolation features, gate features, source/drain features (including epitaxial source/drain features), interconnect features, other features, or combinations thereof). In the depicted embodiment, wafer 210 includes a semiconductor substrate, such as a silicon substrate. Alternatively or additionally, wafer 210 includes another elementary semiconductor, such as germanium; a compound semiconductor, such as silicon carbide, gallium arsenide, gallium phosphide, indium phosphide, indium arsenide, and/or indium antimonide; an alloy semiconductor, such as SiGe, GaAsP, AnnAs, AlGaAs, GaInAs, GaInP, and/or GaInAsP; or combinations thereof. Alternatively, wafer 210 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

A material layer 220 to be processed (also referred to herein as an underlying layer) is disposed over wafer 210. However, the present disclosure contemplates implementations where material layer 220 is omitted, such that wafer 210 is directly processed. In some implementations, material layer 220 includes a conductive material or a semiconductor material, such as metal or metal alloy. In some implementations, the metal includes titanium (Ti), aluminum (Al), tungsten (W), tantalum (Ta), copper (Cu), cobalt (Co), ruthenium (Ru), other suitable metal, or combinations thereof. In some implementations, the metal alloy includes metal nitride, metal sulfide, metal selenide, metal oxide, metal silicide, other suitable metal alloy, or combinations thereof. In such implementations, the metal alloy can be represented by a formula $MX_a$, where M is a metal and X is selected from the group consisting of nitrogen (N), sulfur (S), selenide (Se), oxygen (O), and silicon (Si). In some implementations, a is about 0.4 to about 2.5. For example, in some implementations, material layer 220 includes titanium nitride (TiN), tungsten nitride ($WN_2$), or tantalum nitride (TaN). Alternatively, in some implementations, material layer 220 includes a dielectric material, such as silicon oxide ($SiO_2$), silicon nitride (SiN), metal oxide, or metal nitride. In such implementations, a material of material layer 220 can be represented by a formula $MX_b$, where M is a metal (for example, Al, hafnium (Hf), or lanthanum (La)) or Si and X is N, O, and/or carbon (C). In some implementations, b is about 0.4 to about 2.5. For example, in some implementations, material layer 220 includes $SiO_2$, SiN, silicon oxynitride (SiON), silicon carbon nitride (SiCN), silicon carbide (SiC), aluminum oxide ($Al_2O_3$), hafnium oxide ($HfO_2$), or lanthanum oxide ($La_2O_3$). In some implementations, the dielectric material has a dielectric constant (k) of about 1 to about 40, such that the dielectric material can be a low-k dielectric material or a high-k dielectric material depending on IC design requirements. In some implementations, material layer 220 is a hard mask layer to be patterned for use in subsequent processing of workpiece 200. In some implementations, material layer 220 is an anti-reflective coating (ARC) layer. In some implementations, material layer 220 is a layer to be used for forming a gate feature (for example, a gate dielectric and/or a gate electrode), a source/drain feature (for example, an epitaxial source/drain), and/or a contact feature (for example, a conductive or dielectric feature of a multilayer interconnect (MLI)) of workpiece 200. In some implementations, where workpiece 200 is fabricated into a mask for patterning IC devices, wafer 210 can be a mask substrate that includes a transparent material (for example, quartz) or a low thermal expansion material (for example, silicon oxide titanium). In such implementations, material layer 220 is a layer to be processed to form an IC pattern therein, such as an absorber layer (for example, material layer 220 includes chromium).

A resist layer 230 is formed over wafer 210 by any suitable process. Resist layer 230 is also referred to as a photoresist layer, photosensitive layer, imaging layer, patterning layer, or radiation sensitive layer. Resist layer 230 is sensitive to radiation used during a lithography exposure process, such as DUV radiation, EUV radiation, e-beam radiation, ion beam radiation, and/or other suitable radiation. In some implementations, resist layer 230 is sensitive to radiation having a wavelength less than about 250 nm. In the depicted embodiment, resist layer 230 is formed by spin coating a liquid resist material, such as resist material 10 or resist material 30 described above, onto a material layer to be processed, such as material layer 220. For example, resist layer 230 includes polymer 12, ALG component 14 having cross-linking functional component 22 bonded thereto, resist component 16, PAG component 18, and/or other suitable resist components mixed in solvent 20. In some implementations, resist layer 230 further includes cross-linker 32 mixed in solvent 20. After spin coating the liquid resist material (but before performing an exposure process), a pre-bake process can be performed on resist layer 230, for example, to evaporate solvent (such as solvent 20) and to densify the liquid resist material formed over material layer 220. In some implementations, before forming resist layer 230, an ARC layer is formed over material layer 220, such that resist layer 230 is formed over the ARC layer. The ARC layer may be a nitrogen-free ARC (NFARC) layer that includes a material such as $SiO_2$, silicon oxygen carbide (SOC), plasma enhanced chemical vapor deposited silicon oxide ($PECVD-SiO_2$), other suitable material, or combinations thereof. In some implementations, more than one layer (including one or more ARC layers) can be formed between material layer 220 and resist layer 230.

Figure 9B:
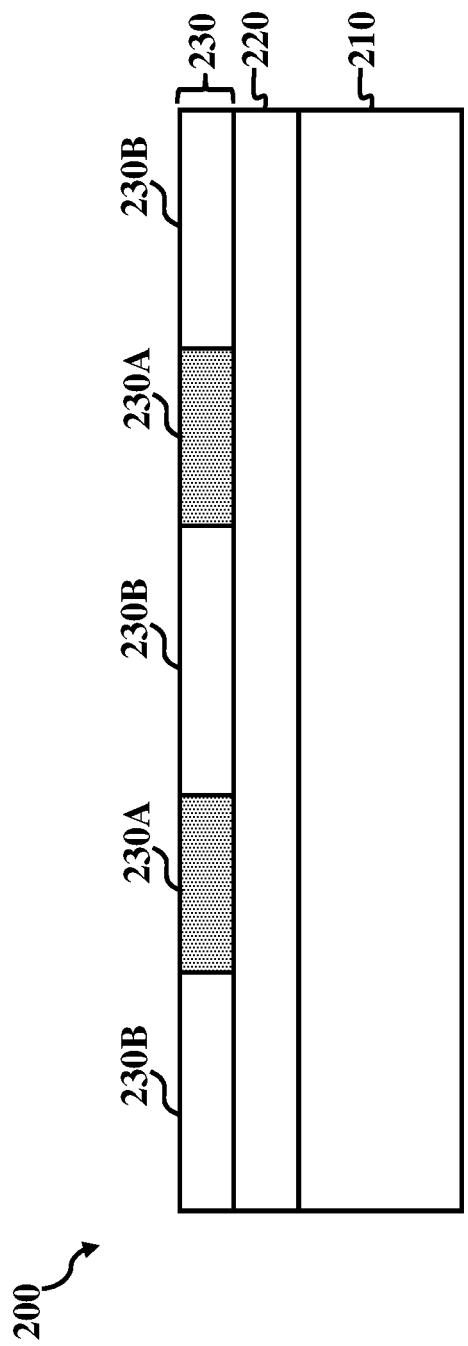

In FIG. 9B, an exposure process is performed on resist layer 230, where resist layer 230 is illuminated with patterned radiation. In some implementations, resist layer 230 is exposed to patterned radiation having a wavelength less than about 250 nm, such as DUV radiation, EUV radiation, x-ray radiation, e-beam radiation, ion-beam radiation, and/or other suitable radiation. The exposure process can be in air, liquid (immersion lithography), or vacuum (for example, when implementing EUV lithography and/or e-beam lithography). In some implementations, the radiation is patterned using a mask having an IC pattern defined therein, such that the patterned radiation forms an image of the IC pattern on resist layer 230. The mask transmits, absorbs, and/or reflects the radiation depending on the IC pattern, along with mask technologies used to fabricate the mask. Various resolution enhancement techniques, such as phase-shifting, off-axis illumination (OAI), and/or optical proximity correction (OPC), may be implemented through the mask or the exposing process. For example, OPC features may be incorporated into the IC pattern. In another example, the mask is a phase-shift mask, such as an alternative phase-shift mask, an attenuated phase-shift mask, or a chromeless phase-shift mask. In yet another example, the exposing process is implemented in an OAI mode. In some implementations, the radiation beam is patterned by directly modulating the radiation beam according to an IC pattern without using a mask (often referred to as maskless lithography).

A latent pattern is formed on resist layer 230 by the exposure process. The latent pattern generally refers to a pattern exposed on the resist layer, which eventually becomes a physical resist pattern when resist layer is subjected to a developing process. The latent pattern includes exposed portions 230A and unexposed portions 230B (which, in some implementations, includes both unexposed portions and under-exposed portions of resist layer 230). In the depicted embodiment, exposed portions 230A physically and/or chemically change in response to the exposure process. For example, PAGs in exposed portions 230A of resist layer 230 generate acid upon absorbing radiation, which functions as a catalyst for causing chemical reactions that increase (or decrease) solubility of exposed portions 230A. For example, acid generated from the PAGs catalyzes cleaving of ALGs from polymers in exposed portions 230A of resist layer 230. In some implementations, after the exposure process, a post-exposure baking (PEB) process is performed on resist layer 230. The PEB process increases a temperature of resist layer 230 to about 80° C. to about 180° C. In some implementations, the PEB process is performed in a thermal chamber, increasing a temperature of resist layer 230 to about 120° C. to about 150° C. During the PEB process, ALG components cleave from polymers in exposed resist portions 230A of resist layer 230, thereby chemically changing exposed resist portions 230A. For example, in the depicted embodiment, the exposure process and/or the PEB process increase hydrophilicity of exposed portions 230A (in other words, the polymers become more hydrophilic), increasing solubility of exposed portions 230A to a developer. Alternatively, in some implementations, the exposure process and/or the PEB process decrease hydrophilicity of exposed portions 230A (in other words, the polymers become more hydrophobic), decreasing solubility of exposed portions 230A to the developer.

Before developing resist layer 230, a treatment is performed on resist layer 230 to reduce solubility of portions of resist layer 230 to a developer. In the depicted embodiment, the treatment induces cross-linking of ALG components of resist layer 230, for example, via cross-linkable functional components 22 and/or cross-linkers 32 as described above, such that a molecular weight of the polymers of resist layer 230 (for example, polymers 12) is increased in the portions of resist layer 230. In some implementations, resist layer 230 is treated before the exposure process. In some implementations, resist layer 230 is treated after the PEB process. Regardless of whether resist layer 230 is treated before or after the exposure process, when resist layer 230 is subjected to a development process, ALG components in unexposed portions 230B of resist layer 230 are cross-linked via cross-linkable functional components 22 and/or cross-linkers 32, which reduces solubility of unexposed portions 230B to a developer. Since the ALG components cleave from the polymers in exposed portions 230A of resist layer 230 during the exposure process, solubility of exposed portions 230A to the developer is maintained. The treatment can thus suppress swelling of unexposed portions 230B by indirectly increasing a molecular weight of the polymers of resist layer 230 in unexposed portions 230B relative to a molecular weight of the polymers of resist layer 230 in exposed portions 230A.

In some implementations, the treatment is a thermal treatment that heats resist layer 230 to a temperature that induces cross-linking of cross-linkable functional components 22 and/or cross-linkers 32. The treatment thermally heats resist layer to a temperature higher than a temperature used during the PEB process. For example, in some implementations, the treatment heats resist layer 230 to a temperature greater than about 180° C. In some implementations, resist layer 230 is exposed to the thermal treatment for about 15 seconds to about 300 seconds. In some implementations, the treatment is an electromagnetic wave treatment that heats resist layer 230 to a temperature that induces cross-linking of cross-linkable functional components 22 and/or cross-linkers 32. In such implementations, electromagnetic radiation can oscillate a material of resist layer 230, uniformly heating an entire volume of the material from within (in other words, volumetrically heating). The electromagnetic radiation can include radio radiation, microwave radiation, infrared radiation, UV radiation, visible light, other suitable electromagnetic radiation, or combinations thereof. In some implementations, resist layer 230 is exposed to the electromagnetic wave treatment for about 1 second to about 200 seconds. In some implementations, resist layer 230 is exposed to the electromagnetic wave treatment for about 5 seconds to about 30 seconds.

Figure 9C:
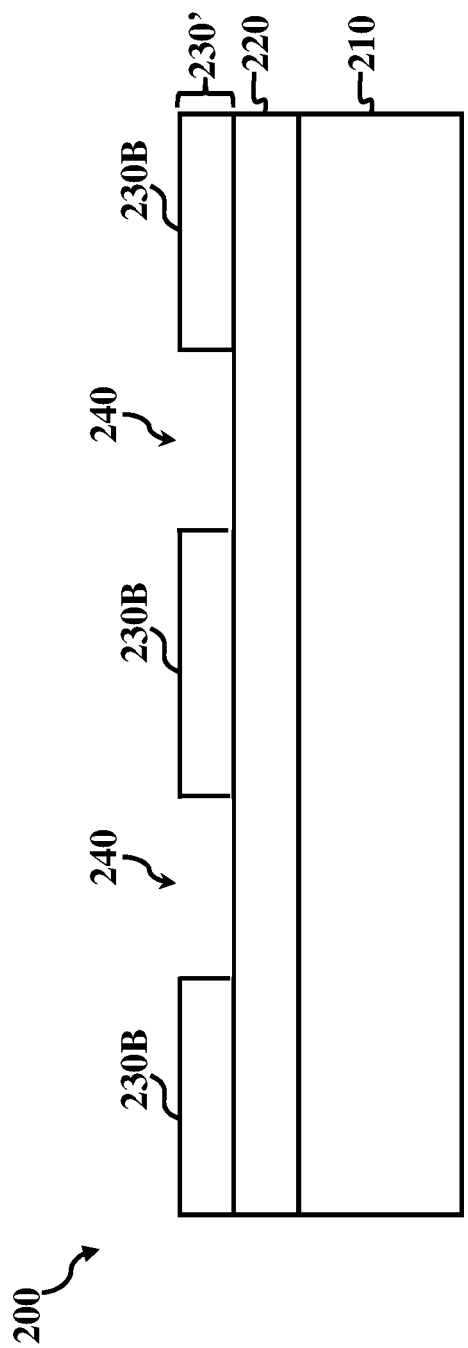

In FIG. 9C, a developing process is performed on resist layer 230, thereby forming patterned resist layer 230'. In the depicted embodiment, a positive tone development (PTD) process is performed to remove exposed portions 230A of resist layer 230. For example, a PTD developer is applied to resist layer 230 that dissolves exposed portions 230A, leaving patterned resist layer 230B having openings 240 defined therein between unexposed portions 230B (collectively referred to as a resist pattern). In some implementations, the PTD developer includes an aqueous base solvent, such as TMAH or tetrabutylammonium hydroxide (TBAOH). By cross-linking unexposed portions 230B of patterned resist layer 230' as described herein, the developing process is unable to penetrate unexposed portions 230B, causing minimal (to no) swelling of unexposed portions 230B. Openings 240 are thus defined by relatively smooth edges and/or sidewalls of unexposed portions 230B, such that the resist pattern of patterned resist layer 230' exhibits minimal LER/LWR and improved resist contrast, significantly enhancing lithography resolution.

Figure 9D:
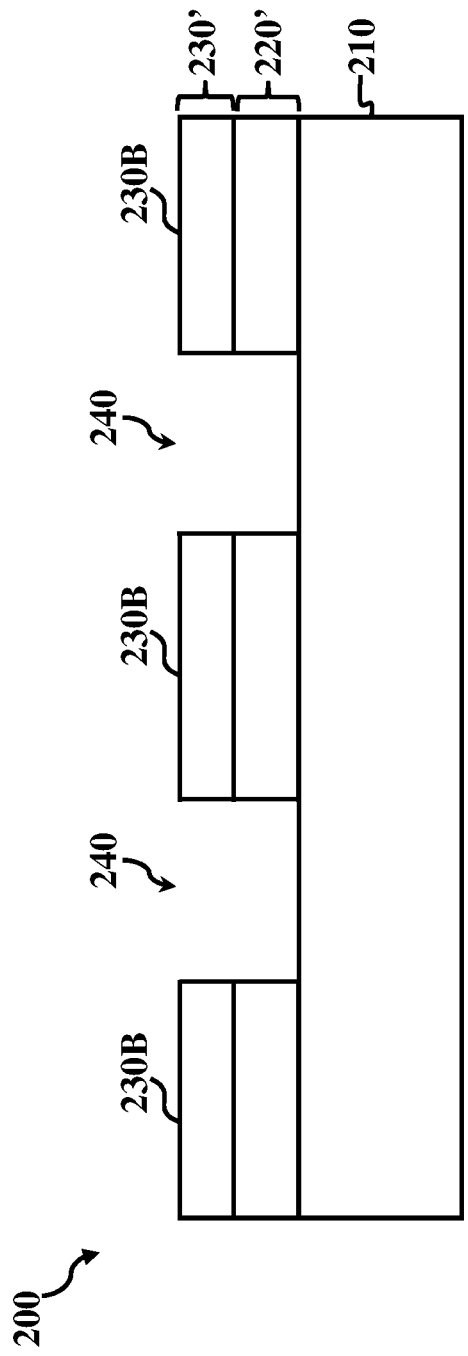
Figure 9E:
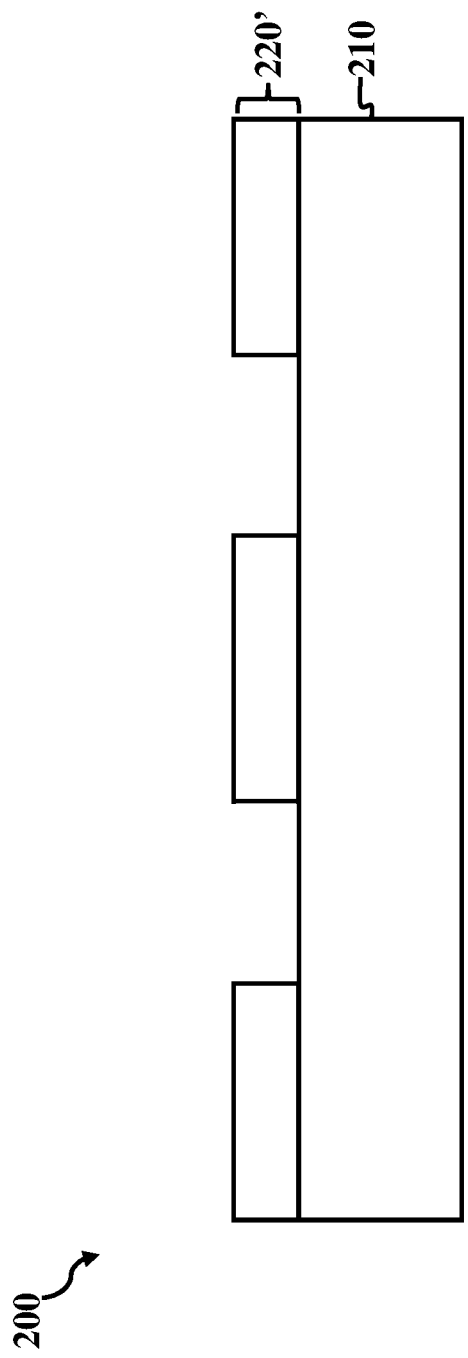

In FIG. 9D, a fabrication process is performed on workpiece 200, such as material layer 220 and/or wafer 210, using patterned resist layer 230' as a mask. For example, the fabrication process is applied only to portions of workpiece 200 within openings 240 of patterned resist layer 230', while other portions of workpiece 200 covered by patterned resist layer 230' are protected from being impacted by the fabrication process. In some implementations, the fabrication process includes performing an etching process on material layer 220 using patterned resist layer 230' as an etching mask. A pattern is thus transferred from patterned resist layer 230' to material layer 220, thereby forming patterned material layer 220'. In implementations where material layer 220 is a hard mask layer, the pattern is first transferred from patterned resist layer 230' to material layer 220, and then the pattern is transferred from patterned material layer 220' to a material layer of wafer 210. The etching process includes a dry etching process, a wet etching process, other suitable etching process, or combinations thereof. Alternatively, in some implementations, the fabrication process includes performing an implantation process on material layer 220 using patterned resist layer 230' as an implant mask, thereby forming various doped features (regions) in material layer 220. Thereafter, turning to FIG. 9E, patterned resist layer 230' is removed from workpiece 200 using any suitable process, such as a resist stripping process, leaving patterned material layer 220' disposed over wafer 210. In some implementations, patterned resist layer 230' may be partially consumed during the fabrication process, such as during the etching process, such that any remaining portion of patterned resist layer 230' is subsequently removed by the resist stripping process.

The present disclosure provides various lithography resist materials and corresponding lithography techniques for improving lithography resolution. An exemplary lithography method includes performing a treatment process on a resist layer to cause cross-linking of acid labile group (ALG) components of the resist layer via cross-linkable functional components, performing an exposure process on the resist layer, and performing a development process on the resist layer, thereby forming a patterned resist layer over a workpiece. The treatment process is performed before or after the exposure process. In some implementations, the method further includes performing a post exposure baking (PEB) process on the resist layer, where the resist layer is treated after performing the PEB process. The PEB process is performed at a lower temperature than the treatment process. In some implementations, the treatment process includes performing a thermal treatment to heat the resist layer. In some implementations, the treatment process includes performing an electromagnetic wave treatment to heat the resist layer. In some implementations, the resist layer includes exposed portions and unexposed portions after the exposure process, and the treatment process reduces solubility of the unexposed portions to a developer used during the development process by increasing a molecular weight of a polymer in the unexposed portions. In some implementations, the developer removes the exposed portions. In some implementations, the resist layer includes a first portion and a second portion, and the treatment process causes a molecular weight of a polymer of the resist layer in the first portion to be greater than a molecular weight of the polymer of the resist layer in the second portion.

Another exemplary lithography method includes exposing a resist layer to patterned radiation (where the exposed resist layer includes an exposed portion and an unexposed portion) and treating the resist layer to reduce solubility of the unexposed portion to a developer. The method further includes baking the resist layer and developing the resist layer using the developer, where the developer removes the exposed portion, thereby forming a patterned resist layer. In some implementations, treating the resist layer includes inducing cross-linking in the unexposed portions. In some implementations, the resist layer is treated before exposing the resist layer to the patterned radiation. In some implementations, the resist layer is treated after baking the resist layer. In some implementations, the treating is performed at a first temperature, and the baking is performed at a second temperature, where the first temperature is higher than the second temperature. In some implementations, the treating includes performing a thermal treatment to heat the resist layer. In some implementations, the treating includes performing an electromagnetic wave treatment to heat the resist layer.

Yet another exemplary lithography method includes forming a resist layer over a workpiece, wherein the resist layer includes polymers, photoacid generator (PAG) components that generate acid in response to radiation, acid labile group (ALG) components that cleave from the polymers in response to acid generated by the PAGs, and cross-linkable functional components. The method further includes performing a treatment process on the resist layer, wherein the treatment process causes cross-linking of the ALG components via the cross-linkable functional components. The method further includes performing an exposure process on the resist layer and performing a development process on the resist layer. The exposure process causes the PAG components to generate the acid. In some implementations, the resist layer further includes cross-linkers, where the treatment process causes cross-linking of the cross-linkable functional components via the cross-linkers. In some implementations, the resist layer includes a first portion and a second portion, and the treatment process causes a molecular weight of the polymers of the resist layer in the first portion to be greater than a molecular weight of the polymers of the resist layer in the second portion. In some implementations, the treatment process is performed after a post-exposure baking process.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A lithography method comprising:
   performing a treatment process on a resist layer to cause cross-linking of acid labile group (ALG) components, wherein the ALG components are cross-linked to one another by cross-linkable functional components;

performing an exposure process on the resist layer; and performing a development process on the resist layer, thereby forming a patterned resist layer over a workpiece.

2. The lithography method of claim 1, wherein the resist layer includes an exposed portion and an unexposed portion after the exposure process, and further wherein the treatment process reduces solubility of the unexposed portion to a developer used during the development process by increasing a molecular weight of a polymer in the unexposed portion.

3. The lithography method of claim 2, wherein the developer removes the exposed portion.

4. The lithography method of claim 1, wherein the treatment process is performed before performing the exposure process.

5. The lithography method of claim 1, wherein the treatment process is performed after performing the exposure process.

6. The lithography method of claim 1, further comprising performing a post exposure baking (PEB) process on the resist layer, wherein the resist layer is treated after performing the PEB process, and further wherein the PEB process is performed at a lower temperature than the treatment process.

7. The lithography method of claim 1, wherein the treatment process includes performing a thermal treatment to heat the resist layer.

8. The lithography method of claim 1, wherein the treatment process includes performing an electromagnetic wave treatment to heat the resist layer.

9. The lithography method of claim 1, wherein the resist layer includes a first portion and a second portion, and further wherein the treatment process causes a molecular weight of a polymer of the resist layer in the first portion to be greater than a molecular weight of the polymer of the resist layer in the second portion.

10. The lithography method of claim 1, wherein the resist layer further includes cross-linkers, and the cross-linkable functional components are cross-linked via the cross-linkers.

11. A lithography method comprising:

exposing a resist layer to patterned radiation, wherein the resist layer includes an exposed portion and an unexposed portion;

baking the resist layer;

treating the resist layer to induce cross-linking of acid labile group (ALG) components, wherein the ALG components are cross-linked to one another by cross-linkable functional components in the unexposed portion; and developing the resist layer to remove the exposed portion, thereby forming a patterned resist layer.

12. The lithography method of claim 11, wherein the resist layer is treated after baking the resist layer.

13. The lithography method of claim 11, wherein the treating is performed at a first temperature, and the baking is performed at a second temperature, wherein the first temperature is higher than the second temperature.

14. The lithography method of claim 11, wherein the treating includes performing a thermal treatment to heat the resist layer.

15. The lithography method of claim 11, wherein the treating includes performing an electromagnetic wave treatment to heat the resist layer.

16. The lithography method of claim 11, wherein the resist layer further includes cross-linkers, and the cross-linkable functional components are cross-linked via the cross-linkers.

17. A lithography method comprising:

forming a resist layer over a workpiece, wherein the resist layer includes polymers, photoacid generator (PAG) components that generate acid in response to radiation, acid labile group (ALG) components that cleave from the polymers in response to acid generated by the PAG components, and cross-linkable functional components;

performing a treatment process on the resist layer such that the ALG components are cross-linked to one another by the cross-linkable functional components and the cross-linkable functional components are cross-linked to one another by cross-linkers;

performing an exposure process on the resist layer, wherein the exposure process causes the PAG components to generate the acid; and performing a development process on the resist layer.

18. The lithography method of claim 17, wherein the resist layer includes a first portion and a second portion, and further wherein the treatment process causes a molecular weight of the polymers of the resist layer in the first portion to be greater than a molecular weight of the polymers of the resist layer in the second portion.

19. The lithography method of claim 17, wherein the treatment process is performed after a pre-exposure baking process.

20. The lithography method of claim 19, wherein the treatment process is performed at a first temperature, and the pre-exposure baking process is performed at a second temperature, wherein the first temperature is higher than the second temperature.

* * * * *